United States Patent [19]

Stickel

[11] 4,104,860
[45] Aug. 8, 1978

[54] HIGH SPEED DYNAMIC FLIP-FLOP SYSTEM

[75] Inventor: Tedd Stickel, Chalfont, Pa.

[73] Assignee: Solid State Scientific Inc., Montgomeryville, Pa.

[21] Appl. No.: 754,428

[22] Filed: Dec. 27, 1976

[51] Int. Cl.² ............... G04C 3/00; H03K 23/30; H03K 3/353
[52] U.S. Cl. ............... 58/23 R; 58/23 AC; 307/208; 307/225 C; 307/265; 307/279; 307/200 B
[58] Field of Search ............... 58/23 A, 23 AC, 23 D; 307/208, 265, 220 R, 220 C, 225 R, 225 C, 269, 279, 221 C, 200 B

[56] References Cited

U.S. PATENT DOCUMENTS

| | | | |
|---|---|---|---|
| 3,737,746 | 6/1973 | Cielaszyk et al. | 58/23 AC X |
| 3,757,510 | 9/1973 | Dill | 307/225 C X |
| 3,812,670 | 5/1974 | Nikaido et al. | 58/23 D X |
| 3,851,189 | 11/1974 | Moyer | 307/279 |
| 3,958,187 | 5/1976 | Suzuki et al. | 307/304 X |
| 3,963,946 | 6/1976 | Zajac | 307/220 C X |
| 3,984,972 | 10/1976 | Yoshino | 58/23 D |
| 3,986,046 | 10/1976 | Wunner | 307/221 C X |

Primary Examiner—Larry N. Anagnos
Attorney, Agent, or Firm—Frailey & Ratner

[57] ABSTRACT

A high speed dynamic CMOS flip-flop system having a master and a slave section each of which have a different total propagation delay. Asymmetrical clock signals are applied to the master and slave sections with one cycle portion of each clock signal turning on the master section and the other cycle turning on the slave section. Each cycle portion has a time duration substantially equal to the total propagation delay of its respective master and slave section. In this manner, the duty cycle of the clock signal cycle is matched to the ratio of the propagation delays of the master and slave sections.

15 Claims, 10 Drawing Figures

ASYMMETRICAL CLOCK

ASYMMETRICAL CLOCK

FIG. 4   SYMMETRICAL CLOCK

HIGH SPEED DYNAMIC FLIP-FLOP SYSTEM

BACKGROUND OF THE INVENTION

A. Field of the Invention

This invention relates to the field of art of high speed dynamic flip-flops.

B. Prior Art

Timing devices are known in which a high frequency crystal controlled oscillator is followed by a series of dynamic flip-flops where the output pulse rate or frequency is a binary submultiple of the crystal frequency. Using integrated circuit technology, the oscillator and the dynamic flip-flops have been formed on a single chip. Since the cost of a crystal decreases as its operating frequency increases it has been desirable to use crystals of as high a frequency as possible. However, the finite slew rates and propagation times associated with the transistors of the first in the series of dynamic flip-flops imposes an upper limit on the crystal frequency at which consistent and reliable operation may be obtained.

It has previously been possible to reduce slew rates and propagation delays of transistors by increasing their area on the surface of the chip. However, this is undesirable since increasing the area of the transistor increases the size of the overall circuit and correspondingly, fewer circuits may be obtained from a given diameter wafer thereby increasing the cost of each circuit. Another penalty imposed by increasing the transistor area is the attendant increase in junction capacitance which causes a corresponding increase in charging current during each transition of the dynamic flip-flop. At high frequencies, this adds significantly to the total chip current drain from the power supply.

A further problem involving the yield of chips from a wafer results from the variations of transistor area from the nominal limits established by the masks and the variation in the diffusion depth during manufacture. In every wafer, a certain percentage of transistors have exhibited longer slew times and longer propagation times (lower gain) than required for a maximum specified crystal frequency and thus entire circuits must be discarded thereby lowering the yield. If the crystal frequency were the same but the gain requirements were decreased, then there would be a resultant increase in the yield.

Accordingly, an object of the present invention is matching the duty cycle of the input clock pulses to the ratio of propogation delays of the master and slave portions of a flip-flop to obtain a higher operating frequency with gates of given gain or to achieve acceptable operation with gates of lower gain at a given operating frequency.

SUMMARY OF THE INVENTION

A high speed dynamic flip-flop system controlled by clock signals having an asymmetrical clock signal cycle and comprises a master and a slave flip-flop section with each of the sections having a different propagation delay. Clock means applies clock signals both to the master and the slave sections with one cycle portion of each clock signal cycle turning on the master section and the other cycle portion turning on the slave section. The one and other cycle portion respectively having time durations substantially equal to the propagation delays of the master and slave sections. In this manner, there is provided a match of the duty cycle of the clock signal to the ratio of the propagation delays of the master and the slave sections.

DETAILED DESCRIPTION

Figure 1:
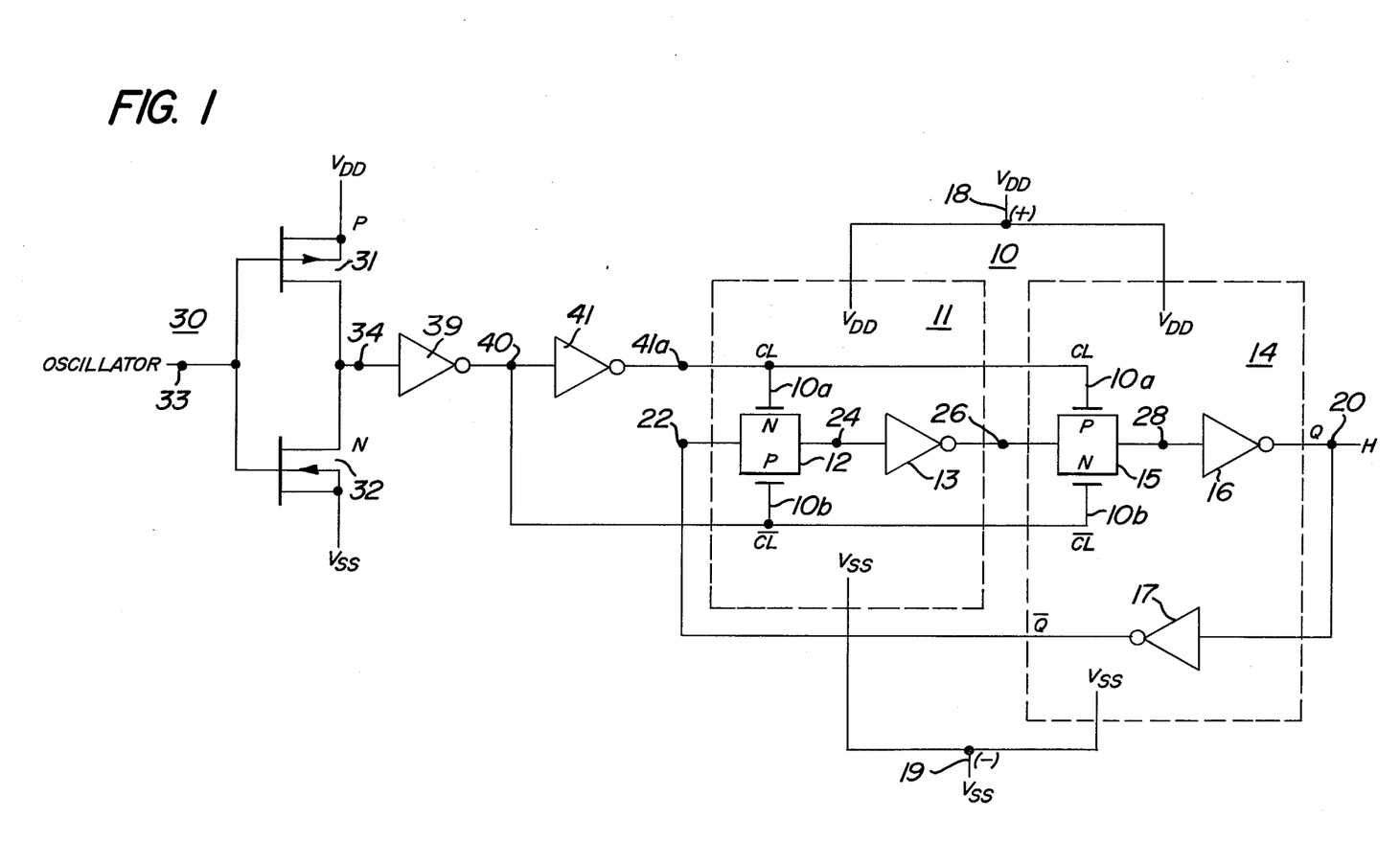
FIG. 1 illustrates in block diagram form a high speed dynamic flip-flop system embodying the present invention.
Figure 5:
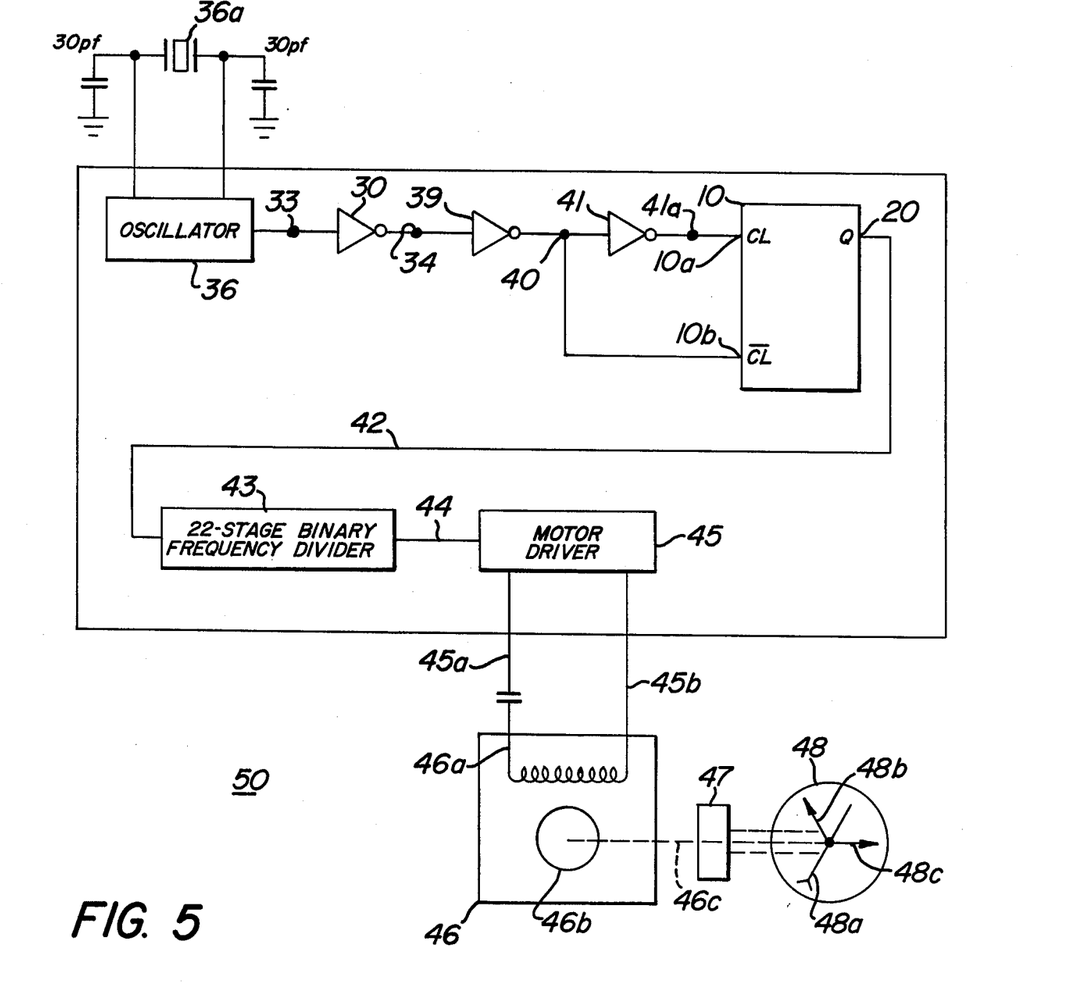
FIG. 5 shows an analog clock system including the flip-flop system of FIG. 1.

Referring now to FIG. 1, there is shown a high speed dynamic flip-flop 10 which is driven by clock pulses applied to its CL and $\overline{CL}$ terminals. It will first be assumed that the clock pulses are symmetrical (50% duty cycle) and are produced by oscillator driven inverters 30, 39 and 41. In this manner, dynamic flip-flop 10 is used for frequency division (counting modulo 2). The circuits of FIG. 1 may be made of CMOS devices and may comprise a portion of a chip including other gates and drivers such as shown in FIG. 5.

Dynamic flip-flop 10 has a master section 11 and a slave section 14. Master section 11 comprises a conventional transmission gate 12 the output of which is coupled by way of junction 24 through inverter 13 to junction 26. Slave section 24 comprises a transmission gate 15 having its input coupled to junction 26. The output of gate 15 is coupled by way of junction 28 through inverter 16, junction 20 ($\overline{Q}$), inverter 17, junction 22(Q) and then back to the input of transmission gate 12. In this way, there is a series circuit of gate 12, inverter 13, gate 15, inverter 16 and inverter 17 which feeds back to gate 12. Transmission gates 12 and 15 and inverters 13, 16, 17 are conventional CMOS circuits with the inverters having positive supply $V_{DD}$ 18 and negative supply $V_{ss}$ 19 applied thereto.

It will be understood that if both gates 12 and 15 were conducting at the same time, all of the junctions would be biased at a point approximately halfway between the voltages of supply terminals 18, 19 because of the negative feedback provided by the odd number of inverting stages. Accordingly, for flip-flop 10 to function, it is necessary that gates 12 and 15 alternate their on-off times. This is accomplished as shown by connecting gates 12 and 15 oppositely with clock pulse CL at terminals 10a and the complement thereof $\overline{CL}$ at terminals 10b. More particularly, clock pulse CL is applied to the gate or control terminals of the N-channel transistor of gate 12 and the P-channel transistor of gate 15. Further, $\overline{CL}$ is applied to the gate or control terminals of the P-channel transistor of gate 12 and the N-channel transistor of gate 15.

Figure 4:
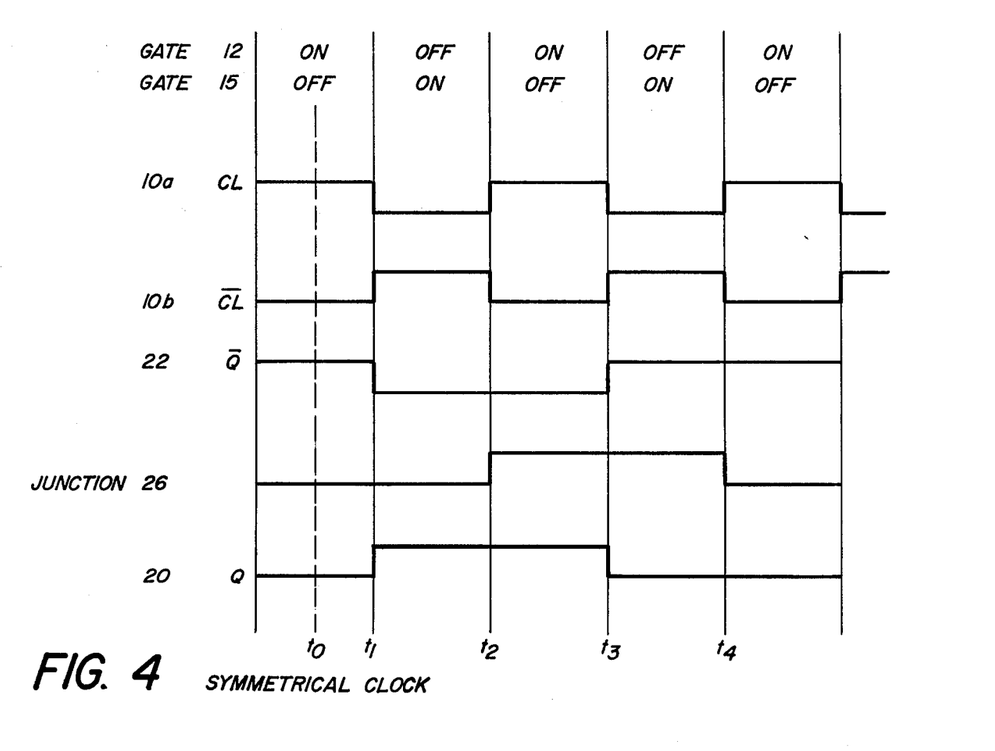
FIG. 4 illustrates waveforms of a symmetrical clock helpful in explaining symmetrical operation of FIG. 1.

FIG. 4 illustrates the voltage waveforms at terminals 10a,b for a substantially 50% duty cycle or symmetrical clock input. FIG. 4 further shows the voltage waveforms at junctions 20, 22 and 26 and the conducting states of the gates. At time $t_0$, it may be assumed that junction 22 is high (approximately equal to the positive supply terminal 18, $V_{DD}$) and gate 12 is turned on. Accordingly, junction 24 is high and junction 26 is therefore low.

At time $t_1$, the clock pulses cause gate 15 to turn on and gate 12 to turn off. Accordingly, the low at junction 26 is applied to junction 28 which thereby causes junction 20 to go high. The high at junction 20 is inverted by inverter 17 to provide a low at junction 22. Since gate 12 is now turned off, this low cannot be applied to junction 24 and cause the defeat of the low at junction 26.

At time $t_2$, gate 12 is now turned on and gate 15 is turned off. The low at junction 22 is applied to junction 24 which causes a high at junction 26. Since gate 15 is turned off, the high at junction 26 cannot defeat the high that is at junction 20. At time $t_3$, gate 12 is turned off again while gate 15 is turned on again. The high at junction 26 is now applied to junction 28 causing junction 20 to go low which in turn makes junction 22 high again. At time $t_4$, gate 12 is turned on thereby applying the high at junction 22 to junction 24 which makes junction 26 to go low. Since gate 15 is turned off at this time, the low at junction 26 cannot defeat the low at junction 20.

It will now be understood that junction 20 (Q) changes state every time gate 15 is turned on. Since gate 15 is turned on just once every period of the clock cycle, it may be seen that two complete clock cycles are required for one complete cycle at junction 20 which is the Q output of flip-flop 10.

Dynamic flip-flop 10 functions with lengthy clock periods provided that care is taken to keep both gates from being on at the same time, and provided that leakage current does not cause the input voltage of an inverter to drift away from its established level during the time that the gate preceding it is turned off. As the period of the clocking voltage is shortened, the frequency of the output signal will rise correspondingly, but an ultimate limit is reached which is imposed by the finite time of propagation through the gates and inverters comprising the flip-flop. In slave section 14, clock voltage CL must be low (and complementary clock voltage $\overline{CL}$ must be high) for a time interval equal to the sum of the propagation delay through gate 15, inverter 16 and inverter 17. This is necessary in order that the signal at junction 26 has time to propagate around and back to junction 22 before gate 15 opens. If gate 15 opens too soon, the voltage at junction 22 would not have time to change fully and the toggling action of this flip-flop may be defeated.

Although the individual propagation delay times of gate 15, inverter 16 and inverter 17 are not necessarily equal, they are approximately so because of techniques used in chip design and fabrication.

For purposes of explanation, it may be assumed that the propagation delay time $t_{PD}$ for each of the active devices of flip-flop 10 is substantially equal. Thus, the propagation delay through slave section 14 from junction 26 to junction 22 is thus equal to 3 $t_{PD}$. Therefore, the half of the clock waveform which turns gate 15 on must be substantially equal to or exceed $3t_{PD}$. If gate 12 is turned on for a similar interval during the other half of the clock signal cycle and if gate 12 and inverter 13 each have a propagation delay substantially equal to $t_{PD}$, it can be seen that gate 12 is turned on for more than enough time to allow the signal at junction 22 to propagate to junction 26. Under these circumstances with the symmetrical clock of FIG. 4, the highest clock frequency that can be applied to flip-flop 10 is equal to $1/(3t_{PD} + 3t_{PD})$ or $1/(6t_{PD})$.

Considering the limitation on operating frequency by the clock waveform of FIG. 4, it will be understood that the clock period could be shortened by reducing the portion of the clock cycle which turns on gate 12 commensurate with the propagation delays of gate 12 and inverter 13. Thus, assuming the propagation delay of gate 12 and inverter 13 are each substantially equal to $t_{PD}$, the clock voltages applied to terminals 10a and 10b need be at levels which turn gate 12 on for a minimum time substantially equal to $2t_{PD}$. Thus, the total period of the asymmetrical clock cycle need only equal or exceed $5t_{PD}$, rather that $6t_{PD}$ as is the case for a clock with symmetrical waveform. Thus, for given gate delays, a maximum operating frequency may be achieved which is 20% higher than that possible when the waveform is symmetrical.

Figure 2A:
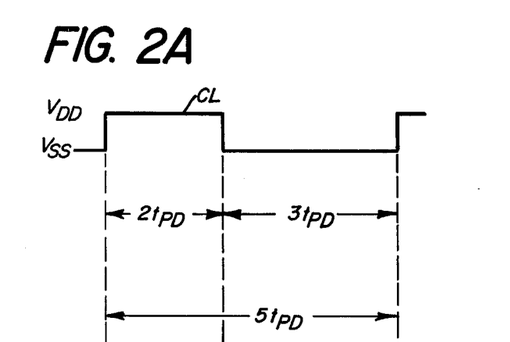
FIGS. 2A–B illustrate waveforms of an asymmetrical clock used in the system of FIG. 1.
Figure 2B:
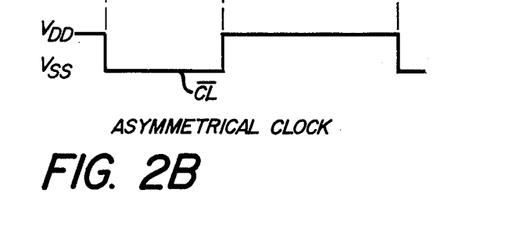

The waveforms of minimum period clock voltages that will operate flip-flop 10 of FIG. 1 are shown in FIGS. 2A and B. The frequency of these voltages is equal to $1/5t_{PD}$. FIG. 2A illustrates the waveform CL, FIG. 2B illustrates the waveform of the complementary clocking voltage $\overline{CL}$.

Figure 3A:
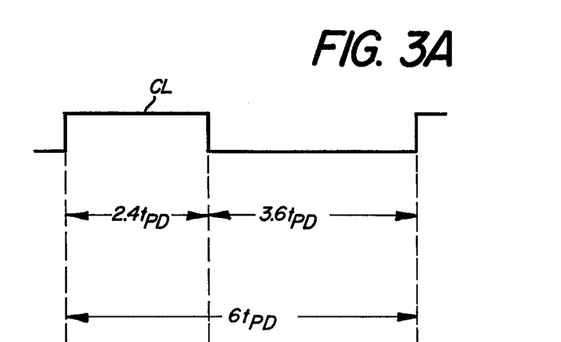
FIGS. 3A–B illustrate waveforms of an asymmetrical clock used in the system of FIG. 1.
Figure 3B:
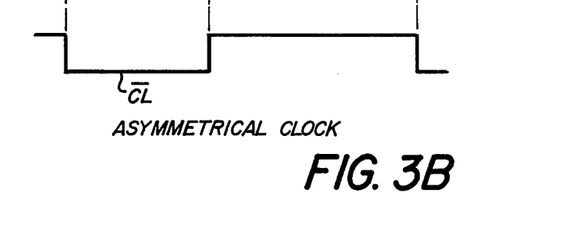

As a corollary, the period of the maximum frequency clock voltage may be set to $6t_{PD}$ as shown in FIGS. 3A and B with the duty cycle maintained in the ratio 2:3 by making voltage CL high for a time substantially equal to $2.4t_{PD}$ and low for a time substantially equal to $3.6t_{PD}$. This then allowed for a 20% lengthening of the gate and inverter propagation times or, putting it another way, a drop to 5/6 of the nominal gain. Thus, with a given maximum operating clock frequency, apportioning the duty cycle in a 2:3 ratio allows operation with lower gain devices thereby increasing the yield of workable chips from a wafer in the process of manufacturing integrated circuits bearing the above described devices.

It may be, of course, possible to achieve a higher operating frequency for flip-flop 10 by utilizing transistors of greater gain and lower propagation delay for the transmission gates and inverters. This, however, would impose a severe size and current drain penalty because, as explained previously, the area occupied by each transistor must then be made larger and this size increase, when multiplied by the many transistors needed to achieve the desired function, increases the total size of the circuit and therefore reduces the number of circuit chips that can be obtained from a given size wafer. Furthermore, the junction capacity exhibited by each transistor increases in direct proportion to the area it occupies, given the same diffusion width. The capacitive charging current that occurs with each voltage transition increases in direct proportion to capacity. The total number of cycles of such transitions in a unit of time adds to the operating current drawn by the chip from the power supply. This current increase is in direct proportion to both the transistor capacity and to its operating frequency. It can thus be seen that savings in both cost and operating power are obtained by utilizing transistors of lower gain and then taking steps to maximize the operating frequency.

It was previously assumed that the symmetrical waveform of FIG. 4 was produced by inverters 30, 39 and 41. It will now be assumed that these same elements produce the above described asymmetrical waveform at the desired duty cycle. This asymmetrical waveform is achieved by proportioning the gains of P-channel device 31 and N-channel device 32 of CMOS inverter 30 which have common input and output junctions 33 and 34. By controlling the dimensions of the active areas during the masking, etching and diffusing processes of wafer manufacture, the gains of transistors 31 and 32 may be degraded in a controlled and coordinated manner to achieve unequal slew rates (the time required for the output voltage to swing from one supply voltage to the opposite supply voltage in response to a step input).

Figure 6A:
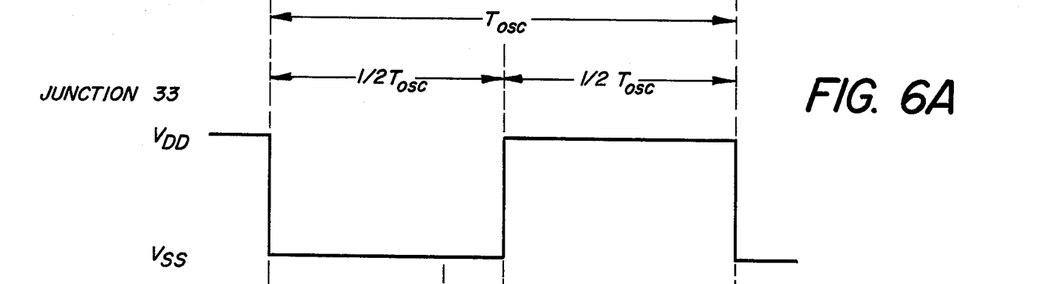
FIGS. 6A–D illustrate waveforms applied to and taken from inverters 30, 39 and 41 of FIG. 1.
Figure 6B:
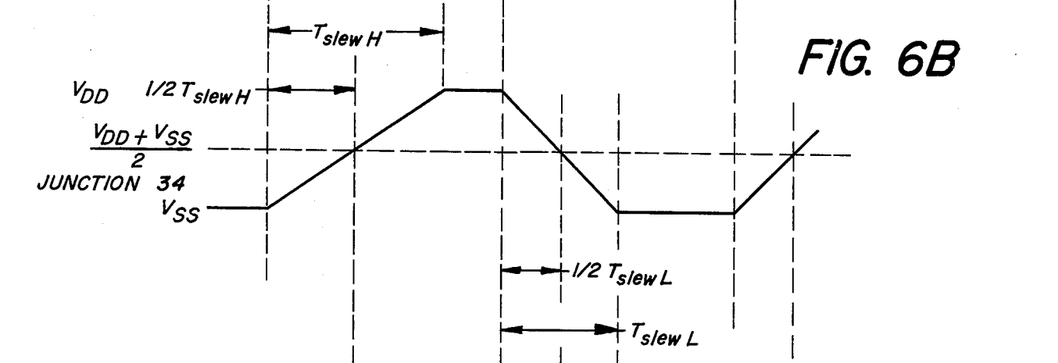

The input and output waveforms of device 30 are shown in FIGS. 6A–B. Waveform 6A represents the voltage available from an oscillator and is assumed to have steep rising and falling edges and a symmetrical duty cycle such that the time that it is low is equal to the time that it is high with the total period represented by $T_{osc}$. Waveform 6B represents the output voltage. It may be assumed that P-channel transistor 31 has a lower gain than the N-channel transistor 32. Thus, when the input waveform goes low, P-channel transistor 31 is turned on and because of its relatively low gain, ramps slowly upward from the low voltage limit to the high voltage limit staying high until the input waveform makes a transition from low to high. At this point, P-channel transistor 31 is turned off and N-channel transistor 32 is turned on causing a transition back from the high limit to the low limit on a downward ramp which is steeper than the upward ramp because of the aforementioned fact that the N-channel transistor has a higher gain than the P-channel transistor. The output stays at the low level until the input waveform once again makes a transition from high back to low starting a new upward transition of the output voltage.

If the output of inverter 30, as illustrated by the waveform of FIG. 6B, is now applied to the input of a conventional inverter having P type and N type transistors whose gains are nominally equal and essentially much higher than the gains of transistors 31 and 32 and both of which switch from their on states to their off states and vice versa when the input voltage is essentially half way between the power supply terminal voltages, then it is seen that the output of such inverter will be an asymmetric waveform whose high and low periods correspond to the time that the output of inverter 30 is above the half voltage point and below the half voltage point.

The time for the upgoing ramp of waveform 6B to reach the positive supply voltage following the high-to-low transition of input waveform 6A is equal to $T_{slewH}$. Since the ramp is assumed linear, the time to reach the half voltage point is $(T_{slewH}/2)$. Similarly, the time required for the downward ramp to progress halfway from the high voltage limit to the low voltage limit following the low to high transition of the voltage of waveform 6A is denoted by $(T_{slewL}/2)$. From this it is readily apparent that the time that waveform 6B is higher than the half voltage point is given by $$T_{outH} = \frac{T_{osc}}{2} - \frac{T_{slewH}}{2} + \frac{T_{slewL}}{2} \quad (1)$$

The time that the voltage of waveform 6B is lower than the half voltage level is given by equation (2)

$$T_{outL} = \frac{T_{osc}}{2} - \frac{T_{slewL}}{2} + \frac{T_{slewH}}{2} \quad (2)$$

To express the high and low output times more conveniently in terms of the input oscillator period, equations (1) and (2) can be written as follows:

$$T_{outH} = \frac{T_{osc}(1 - H + L)}{2} \quad (3)$$

$$T_{outL} = \frac{T_{osc}(1 + H - L)}{2} \quad (4)$$

where:

$$H = \frac{T_{slewH}}{T_{osc}}$$

$$L = \frac{T_{slewL}}{T_{osc}}$$

From equations (3) and (4), the high/low ratio of the output waveform in terms of the normalized slew rates H and L are given by equation (5)

$$\frac{T_{outL}}{T_{outH}} = \frac{1 + (H - L)}{1 - (H - L)} = R \quad (5)$$

Equation (5) may be solved for the quantity (H-L) in terms of R as follows:

$$H - L = \frac{R - 1}{R + 1} \quad (6)$$

From equation (6), one can compute the required relationship between the high and low slew times from the required output duty cycle. In accordance with the requirements of the asymmetric flip-flop of FIG. 1 in which the propagation times of the gates and inverters are equal, the relation [R = 3/2] must be satisfied. Setting this value for R into equation (6) yields a value ($H - L$) = 1/5. Going back to the definitions of H and L given in conjunction with equations (3) and (4), it follows that $$T_{slewH} - T_{slewL} = \frac{T_{osc}}{5} \quad (7)$$

where $T_{osc}$ is the oscillator period at the maximum desired operating frequency.

Equation (7) thereby illustrates that the difference between the upgoing slew time and the lowgoing slew time must be equal to 1/5 of the oscillator period.

So far, the required difference between the slew rates has been defined. It is now necessary to established each one in absolute terms. Since there is no specific solution the bounds for the high and low slew times are given by the expressions of inequality (8) and (9) as follows:

$$\frac{T_{osc}}{5} \leq T_{slewH} \quad (8)$$

$$0 \leq T_{slewL} \leq \left( T_{slewH} - \frac{T_{osc}}{5} \right) \quad (9)$$

As previously described, the propagation delays of each inverter and transmission gate in flip-flop 10 has been assumed to be substantially equal to each other. However, due to deviations in design and in manufacturing process, this may not be the case and it is quite possible that the total propagation delay through slave section 14 and the total propagation delay through master section 11 are not related in a ratio 3:2, but might be some other ratio such as, for example, 5:4, 2:1, etc. It will be understood to those skilled in the art from the previous discussion that the high/low ratio of the input clock waveform may be made such that the on and off times of the clock waveform are set equal to the propagation delays through the master and slave sections respectively.

The system of FIG. 1 is embodied in an electric analog clock 50 shown in block diagram form in FIG. 5 where similar elements have been identified with corresponding reference characters. Clock 50 comprises a crystal 36a, controlled oscillator 36 whose output is divided down to produce output pulses of 1Hz which are applied to a stepping motor whose shaft drives the second minute and hour hands of a conventional clock display. Alternately, the motor shaft could drive a set of numbered wheels to display the time numerically. All electronic circuits associated with the oscillator, frequency countdown and motor drive are contained on a single chip. Frequency control quartz crystal 36a is external to this chip as are stepping motor 46, gear train 47 and clock face 48.

If 1Hz is the desired output frequency, then the crystal frequency may be any integral power of two provided that the number of frequency division stages which follow the oscillator is equal to the binary exponent. The higher the frequency of oscillation of quartz crystal 36a, the smaller and less costly it is to manufacture. This generally holds true for frequencies up to about 30 MHz. Therefore, it is less costly to utilize the highest feasible crystal frequency with the necessary number of binary stages since the cost of an added binary stage is much less than the cost reduction obtained by doubling the crystal oscillator frequency.

Achievable propagation delay times within the gates and inverters associated with flip-flop 10 that perform the frequency division are typically in the order of 50 nanoseconds. If the first frequency division flip-flop following the oscillator were of the dynamic type as shown in FIG. 1 and if it were driven with symmetrical clock pulses as described earlier, the highest allowable crystal frequency would be $2^{21}$ Hz (approximately 2MHz) because a clock waveform period of at least six propagation delay times or 300 nanoseconds would be required. A $2^{21}$ Hz crystal controlled oscillator would produce a clock period of approximately 500 nanoseconds while the next available binary power frequency, $2^{22}$ Hz would have a clock period of approximately 250 nanoseconds which is less than the minimum clock period dictated by the conventional flip-flop with symmetrical clock as described above.

If, however, a $2^{22}$ Hz crystal controlled oscillator is used to drive the dynamic flip-flop asymmetrically, it then becomes suitable because the clock period is equal to 5 propagation delays. A cost saving can thus be achieved by utilizing the principle of the asymmetrically driven flip-flop.

In clock 50, oscillator 36 produces an essentially symmetric square wave having steep rising and falling edges and a frequency of 4.194304 MHz which appears on junction 33. This signal is coupled to the input of inverter 30 which is constructed in accordance with FIG. 1 and whose N-channel transistors and P-channel transistors have slew rates which differ from each other by an amount such that the ratio of the time the voltage at junction 34 is above the half voltage level to the time that the voltage is below the half voltage level is 2:3. More specifically, from equation (7), the slew time of the positive going ramp must be 50 nanoseconds more than the slew time of the negative going ramp. Typically, the N-channel transistor 32 of FIG. 4 is given sufficient gain so that the time required for it to slew the output at 34 from the positive limit to the negative limit is typically 10 nanoseconds. Then the gain of P-channel transistor 31 is tailored to produce slew times from negative to positive of approximately 60 nanoseconds thereby satisfying the requirements of equation (7).

Figure 6C:
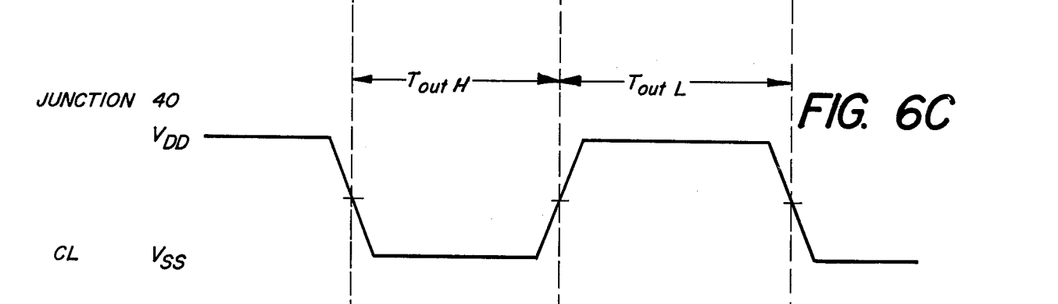
Figure 6D:
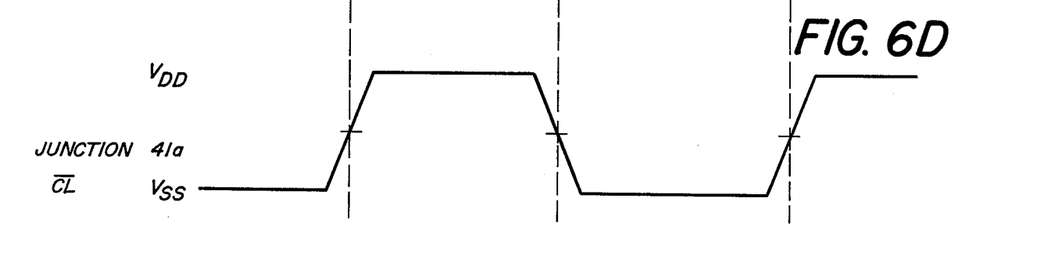

Inverter 39 is constructed with two high gain transistors so that the transitions at its output at junction 40 occur rapidly as the output signal of inverter 30 at junction 38 crosses the voltage midpoint. The waveform of the voltage at junction 40 thus is that shown by the waveform of FIG. 6C. This provides the $\overline{\text{CL}}$ clock signal to the flip-flop 10 while an additional inverter 41 with high gain transistors produces the complement of the aforementioned signal, giving the CL clock signal at junction 41a. The voltage at junction 41a is shown by the waveform of FIG. 6D. The Q output of flip-flop 10 as described previously makes one transition for each cycle of input clock voltage. Therefore, the output at junction 42 is a square wave whose frequency is half that of the crystal controlled oscillator, namely, 2,097152 MHz. This signal has a period which is long enough to drive the next flip-flop without any difficulty. That flip-flop is the first one of a cascaded chain of twenty-three flip-flops which are represented by block 43. The output of this block at junction 44 is thus a square wave having a frequency of ¼ Hz. This signal then drives motor driver 45 whose output terminals 45a and 45b supply pulses of current to the winding 46a of stepper motor 46. A brief pulse of current flows from terminal 45a to 45b when the input signal makes a positive transition. Similarly, a brief pulse of current flows from terminal 45b to terminal 45a when the input signal makes a negative transition. With each pair of forward and reverse current pulses through the winding, the rotor 46b of stepper motor 46 advances 1/60 of a revolution causing the output shaft 46c to make one full revolution per minute. This shaft is coupled directly to the second hand 48a of clock face 48 and through gear train 47 drives the minute hand 48b and the hour hand 48c at appropriate speeds to indicate the time.

What is claimed is:

1. A high speed dynamic flip-flop frequency divider system controlled only by single phase clock signals having an asymmetrical clock signal cycle comprising a cascaded asynchronous chain of flip-flops forming a frequency divider, a first flip-flop of said chain having a master and a slave flip-flop section with each of said sections having a different total propagation delay, an output of said master section being coupled to an input of said slave section and an output of said slave section being coupled to an input of said master section, and clock means for applying said single phase clock signals both to said master and to said slave sections of said first flip-flop but not to the remainder of the flip-flops of said chain with one cycle portion of each clock signal cycle turning on said master section and the other cycle portion turning on said slave section, said one and other cycle portions respectively having time durations substantially equal to said propagation delays of said master and slave sections thereby to match the duty cycle of said clock signal to the ratio of the propagation delays of said master and slave sections.

2. The high speed dynamic flip-flop system of claim 1 in which said master flip-flop section includes at least one gate coupled in series with at least one inverter and said slave flip-flop section includes at least one gate coupled in series with at least two inverters said inverter of said master section being coupled to said gate of said slave section and one of said inverters of said slave section being coupled to said gate of said master section.

3. The high speed dynamic flip-flop system of claim 2 in which the individual propagation delay times of each of said gates and inverters is substantially equal.

4. The high speed dynamic flip-flop system of claim 2 in which said gates are CMOS transmission gates each having a first and a second transistor respectively of one and another conductivity type, said first and second transistors having respectively first and second control terminals.

5. The high speed dynamic flip-flop system of claim 4 in which said clock means comprises a first and a second inverter connected in series each having an input and an output, said output of said second inverter being connected to said first and second control terminals of said first and second transmission gates respectively, said output of said first inverter being coupled to said second and first control terminals of said first and second transmission gates respectively.

6. The high speed dynamic flip-flop system of claim 5 in which said clock means includes a third inverter formed of a P-channel CMOS first device and an N-channel CMOS second device having common input and output junctions, said common output junction being coupled to said input of said first inverter, an oscillator for providing a predetermined symmetrical signal to said common input junction, said first and second devices being of value to provide selected and unequal slew rates whereby said one and other cycle portions of said clock signals have said time durations.

7. A high speed dynamic CMOS flip-flop frequency divider system controlled only by clock means which provides single phase clock signals having a predetermined asymmetrical clock signal cycle comprising a cascaded asynchronous chain of flip-flops forming a frequency divider, a first flip-flop of said chain comprising a master flip-flop section having at least one gate and one inverter, a slave flip-flop section having at least one gate and two inverters, each of said sections having a total predetermined propagation delay different from each other, said inverter of said master section being coupled to said gate of said slave section and one of the inverters of said slave section being coupled to said gate of said master section, and clock means coupled to said master and slave sections of said first flip-flop but not to the remainder of the flip-flops of said chain for providing said single phase clock signals with (1) one portion of each clock signal cycle turning on said master section and turning off said slave section and (2) the other portion of each clock signal cycle turning on said slave section and turning off said master section, said one portion having a time duration substantially equal to said propagation delay of said master section and said other cycle portion having a time duration substantially equal to the propagation delay of said slave section thereby to maximize the operating frequency of said master and slave sections.

8. The high speed dynamic CMOS flip-flop system of claim 7 in which in said master flip-flop section said gate is a transmission gate coupled in series with said inverter and in which in said slave flip-flop section said gate is a transmission gate coupled in series with said two inverters.

9. The high speed dynamic CMOS flip-flop system of claim 8 in which the individual propagation delay times of each of said gates and inverters is substantially equal.

10. The high speed dynamic CMOS flip-flop system of claim 8 in which said gates are CMOS transmission gates each having a first and a second transistor respectively of one and another conductivity type, said first and second transistors having respectively first and second control terminals.

11. The high speed dynamic CMOS flip-flop system of claim 10 in which said clock means comprises a first and a second inverter connected in series and each having an input and an output, said output of said second inverter being connected to said first and second control terminals of said first and second transmission gates respectively, said output of said first inverter being coupled to said second and first control terminals of said first and second transmission gates respectively.

12. The high speed dynamic CMOS flip-flop system of claim 11 in which said clock means includes a third inverter formed of a P-channel first transistor and an N-channel second transistor having common input and output junctions, said common output junction being coupled to said input of said first inverter, an oscillator for providing a selected symmetrical pulse signal in said common input junction, the dimensions of the active areas of said first and second transistors being of value to provide predetermined and differing gains and slew rates whereby said one and other cycle portions of said clock signals have said time durations substantially equal to said propagation delays of said master and slave sections.

13. The high speed dynamic CMOS flip-flop system of claim 12 in which there is provided an analog clock having a motor driver connected to said frequency divider for supplying current pulses, and a stepper motor responsive to said current pulses for advancing the hands of an analog clock.

14. The high speed dynamic CMOS flip-flop system of claim 13 in which said oscillator is crystal controlled for producing a substantially symmetrical square wave pulse signal having steep rising and falling edges.

15. In an analog clock system, a high speed dynamic CMOS flip-flop which is operated only by single phase clock signals having a predetermined asymmetrical clock signal cycle from a crystal controlled oscillator which comprises a master and a slave flip-flop section in which each of the sections have a different total propagation delay, said clock signals being applied both to said master and to said slave sections with one cycle portion of each clock signal cycle turning on said master section and the other cycle portion turning on said slave section, said one and other cycle portions respectively having time durations substantially equal to said propagation delays of said master and slave sections, an output of the master section being coupled to an input of the slave section and an output of the slave section being coupled to an input of the master section, a cascaded asynchronous chain of flip-flops forming a frequency divider coupled to an output of said flip-flop section, said single phase clock signals being applied only to said master and slave flip-flop sections and not to said cascaded chain, a motor driver connected to said frequency divider for providing current pulses proportional to the output signal cycle of said frequency divider, and an analog clock having a stepper motor for operating hands of the clock, said stepper motor responsive to said current pulses for advancing said hands.

* * * * *

UNITED STATES PATENT OFFICE
CERTIFICATE OF CORRECTION

PATENT NO. : 4,104,860
DATED : August 8, 1978
INVENTOR(S) : Tedd Stickel

It is certified that error appears in the above—identified patent and that said Letters Patent are hereby corrected as shown below:

In claim 15, line 20, after "said" insert --slave--.

Signed and Sealed this

Twenty-seventh Day of February 1979

[SEAL]

Attest:

RUTH C. MASON
Attesting Officer

DONALD W. BANNER
Commissioner of Patents and Trademarks